United States Patent [19]

Cline et al.

[11] Patent Number: 4,651,038

[45] Date of Patent: Mar. 17, 1987

[54] GATE HAVING TEMPERATURE-STABILIZED DELAY

[75] Inventors: Ronald L. Cline, Monte Sereno; John G. Campbell, Los Altos, both of Calif.

[73] Assignee: Fairchild Camera & Instrument Corporation, Mountain View, Calif.

[21] Appl. No.: 611,266

[22] Filed: May 17, 1984

Related U.S. Application Data

[63] Continuation-in-part of Ser. No. 518,499, Aug. 1, 1983, abandoned.

[51] Int. Cl.⁴ .................. H03K 5/159; G06G 7/10
[52] U.S. Cl. ............................ 307/591; 307/254; 307/491; 323/313
[58] Field of Search ............ 307/310, 491, 591, 254, 307/296 R, 297; 323/313

[56] References Cited

U.S. PATENT DOCUMENTS

| | | | |
|---|---|---|---|
| 4,249,091 | 2/1981 | Yamagiwa | 307/310 |
| 4,323,854 | 4/1982 | Hester | 307/310 |
| 4,424,461 | 1/1984 | Taguchi et al. | 307/310 |
| 4,532,441 | 7/1985 | Gloaguen | 307/310 |

Primary Examiner—Stanley D. Miller
Assistant Examiner—B. P. Davis
Attorney, Agent, or Firm—Theodore S. Park; Bruce D. Riter; Robert C. Colwell

[57] ABSTRACT

A circuit technique for stabilizing the timing of signals at an output node of a gate, despite substantial variations in temperature. In a gate having a switching portion and an emitter follower, the temperature-dependence of the gate delay within the switching portion may be offset by suitable control of the temperature characteristics of the load current source supplying the emitter follower output node. The load current source comprises a current source resistor, a current source transistor having its collector coupled to the output node, and a reference voltage source. The voltage source, rather than having a zero temperature coefficient as in known temperature-compensated configurations, is configured to have a temperature coefficient chosen to provide a temperature dependence in the delay through the emitter follower that offsets the temperature dependence of the delay through the switching portion so that the total gate delay is substantially temperature-independent. The reference voltage source for the load current source is a modified band-gap regulator comprising a regulating transistor, a current source pair of transistors Q1 and Q2, and first, second, and third resistors. The third resistor changes the current relationships to provide the desired output voltage and temperature coefficient.

6 Claims, 21 Drawing Figures

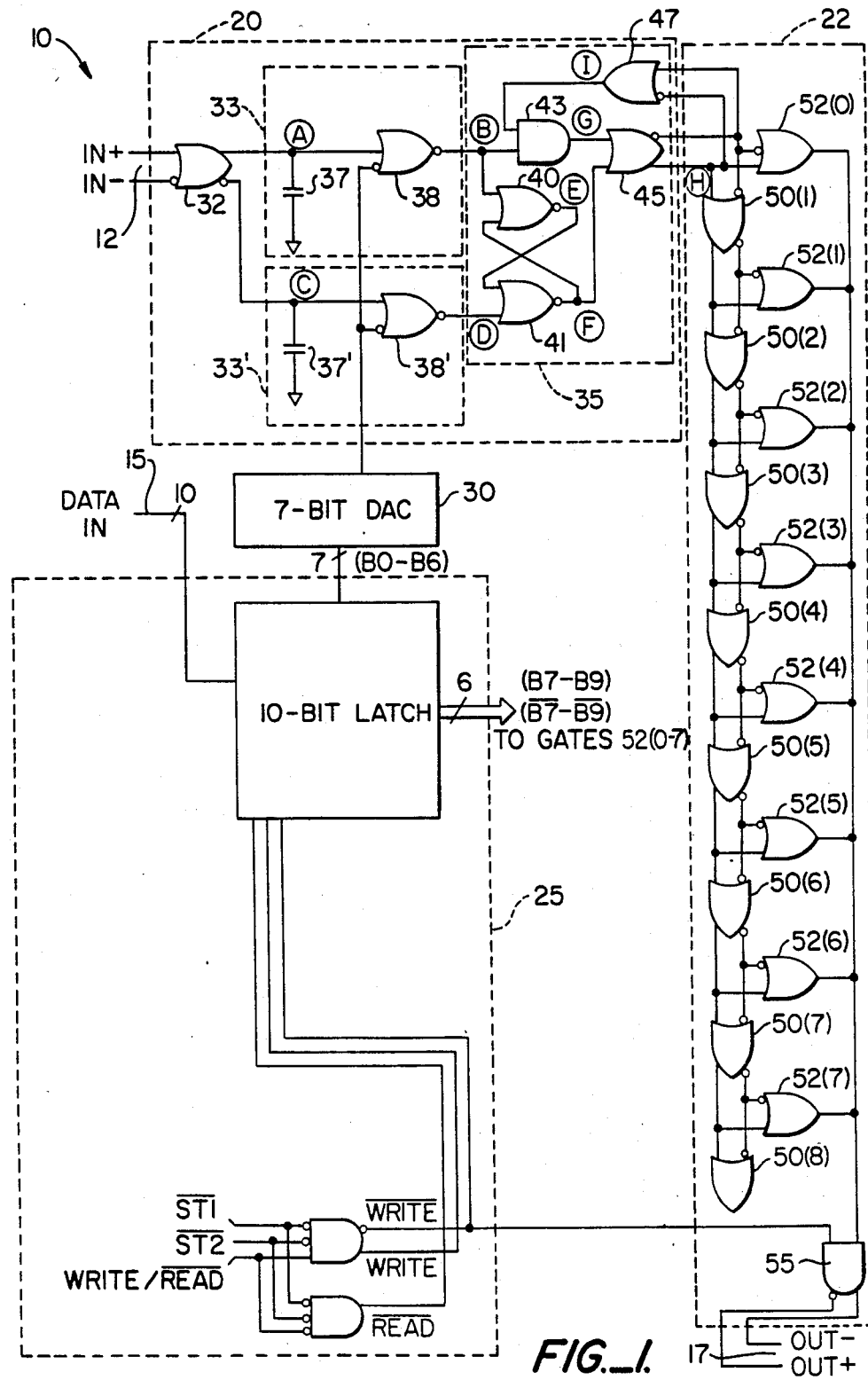
FIG._1.

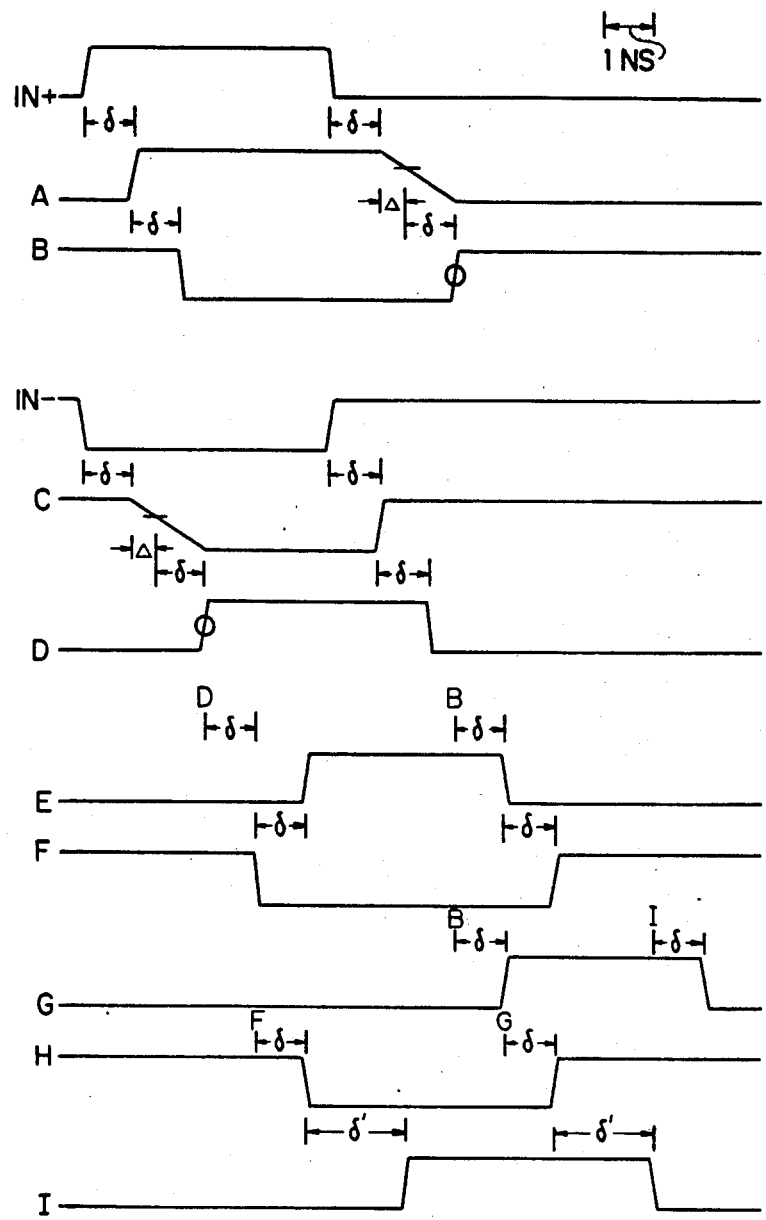
FIG._2.

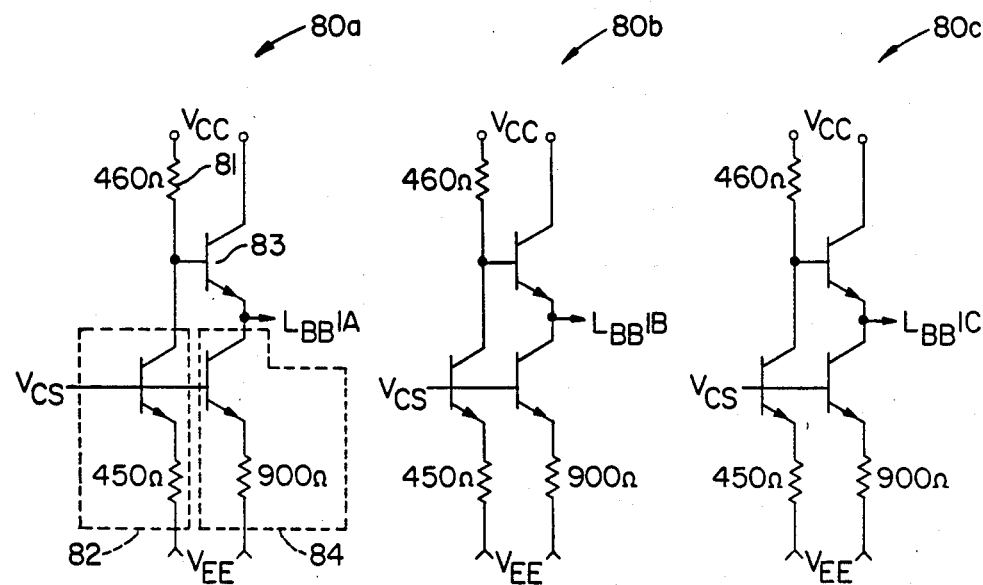
FIG._3A.
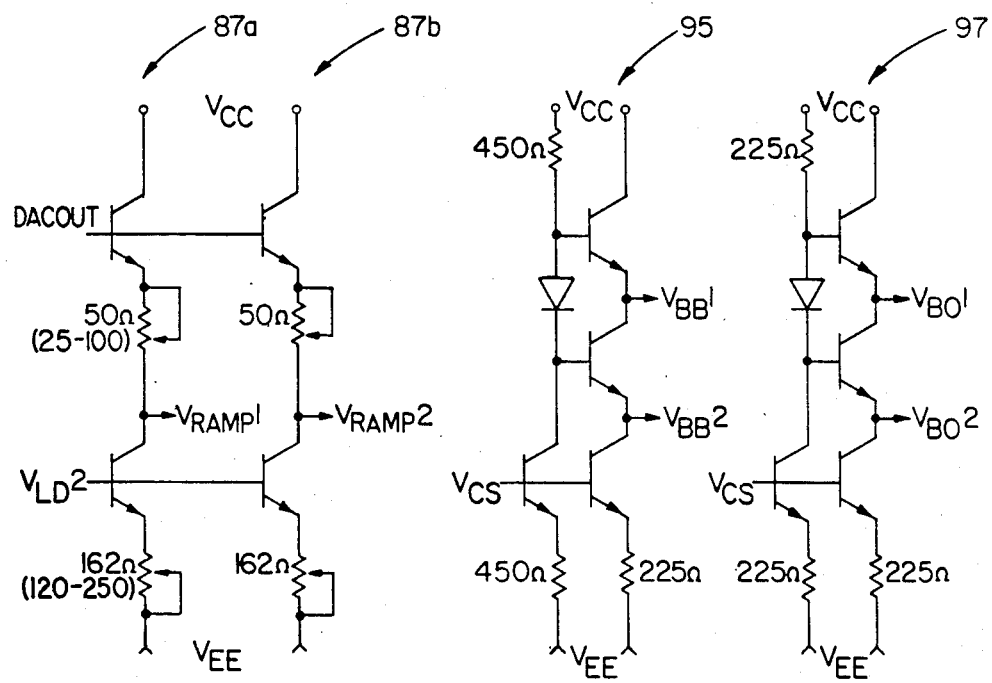
FIG._3B.  FIG._3C.

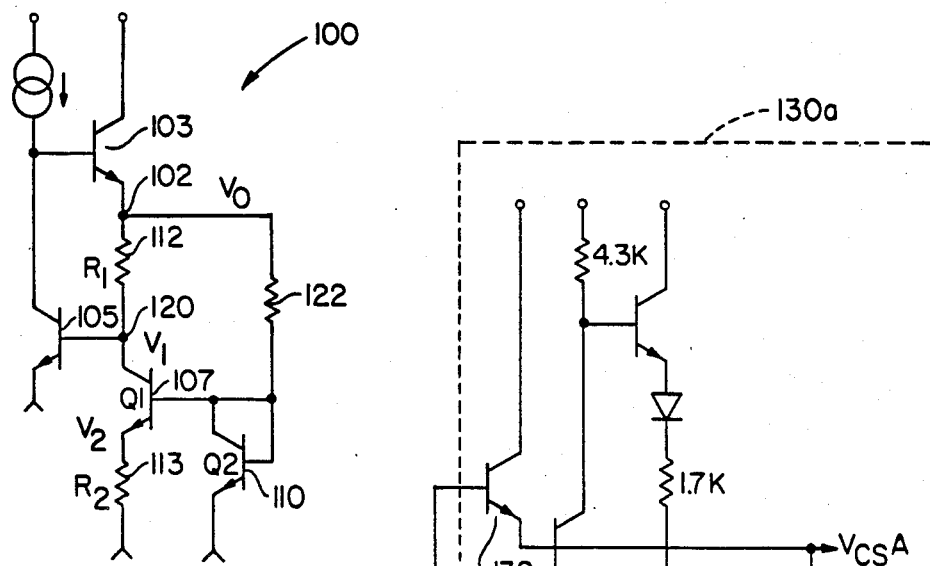
FIG._4A.
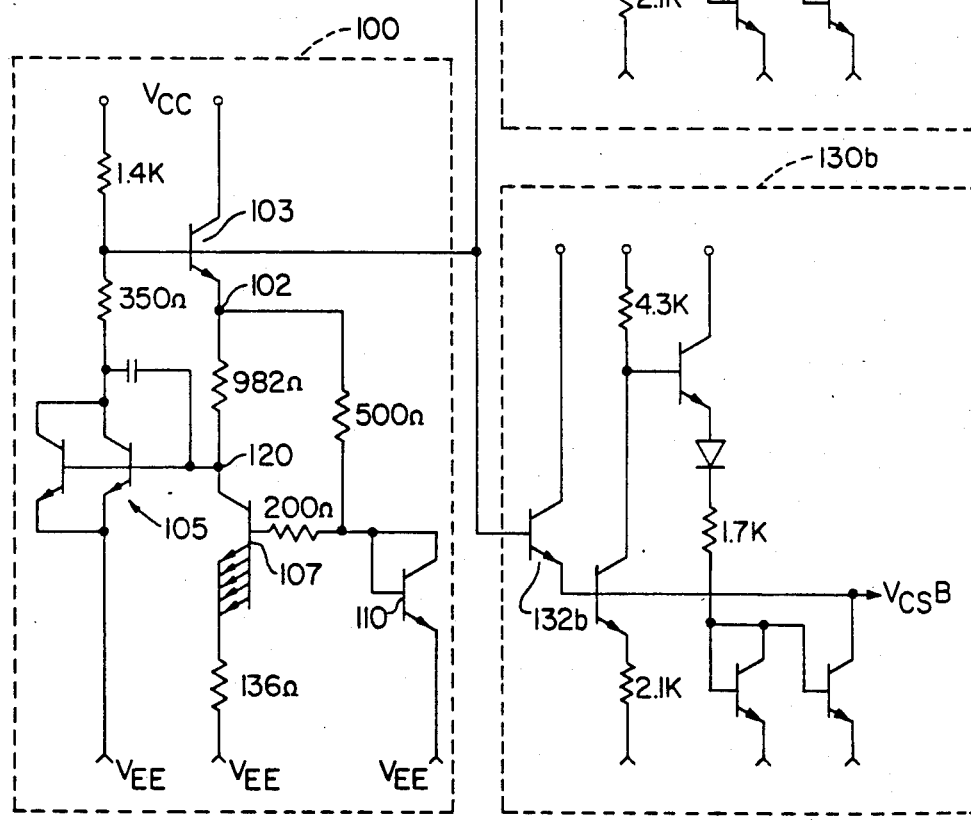
FIG._4B.

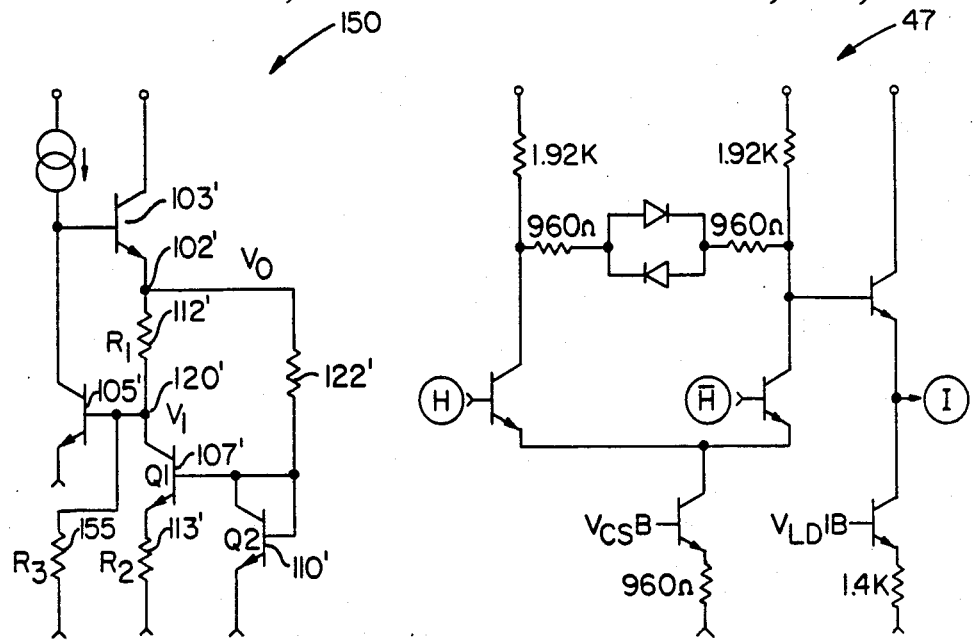
FIG.—5A.
FIG.—7E.
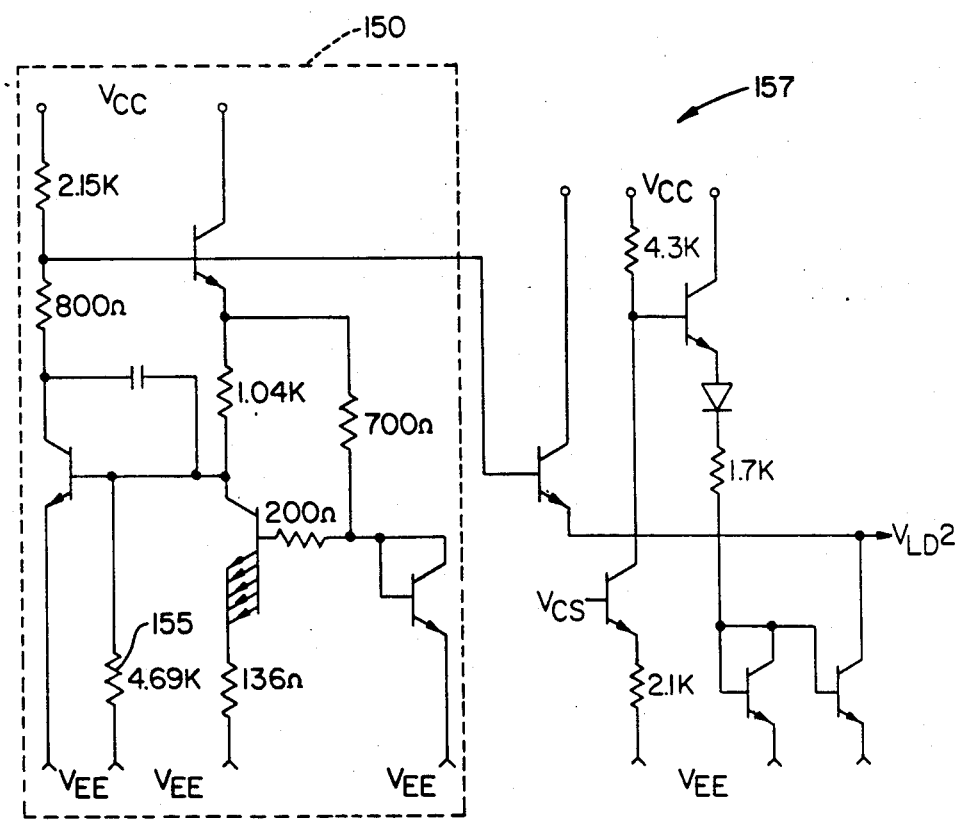
FIG.—5B.

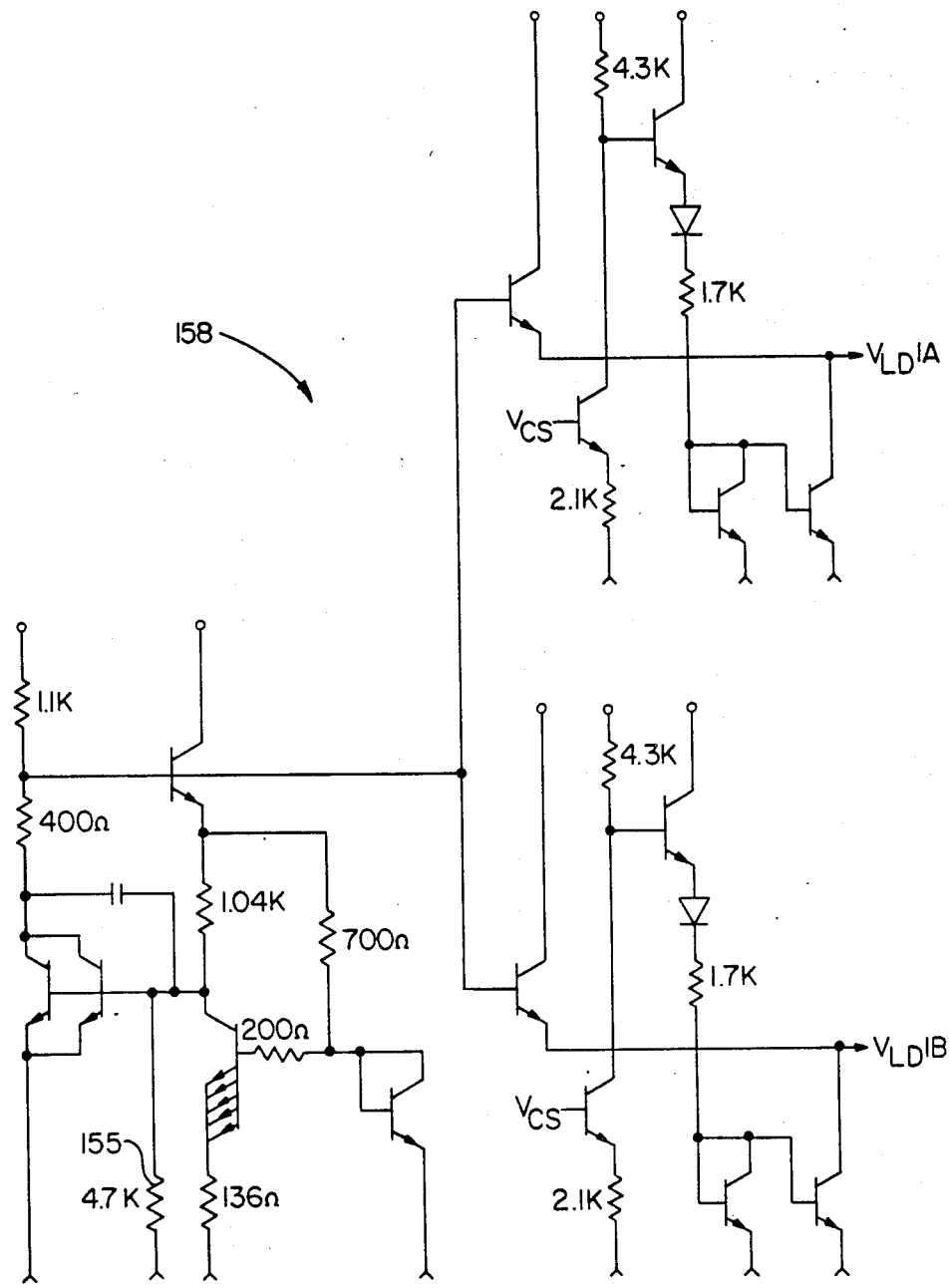
FIG._5C.

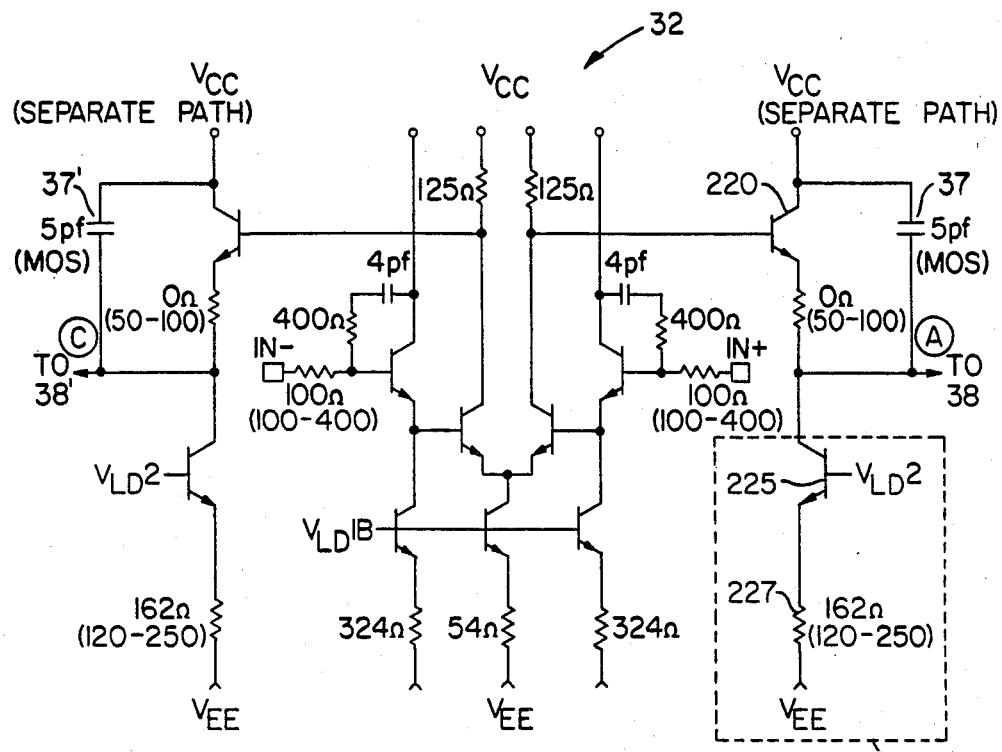
*FIG._6A.*
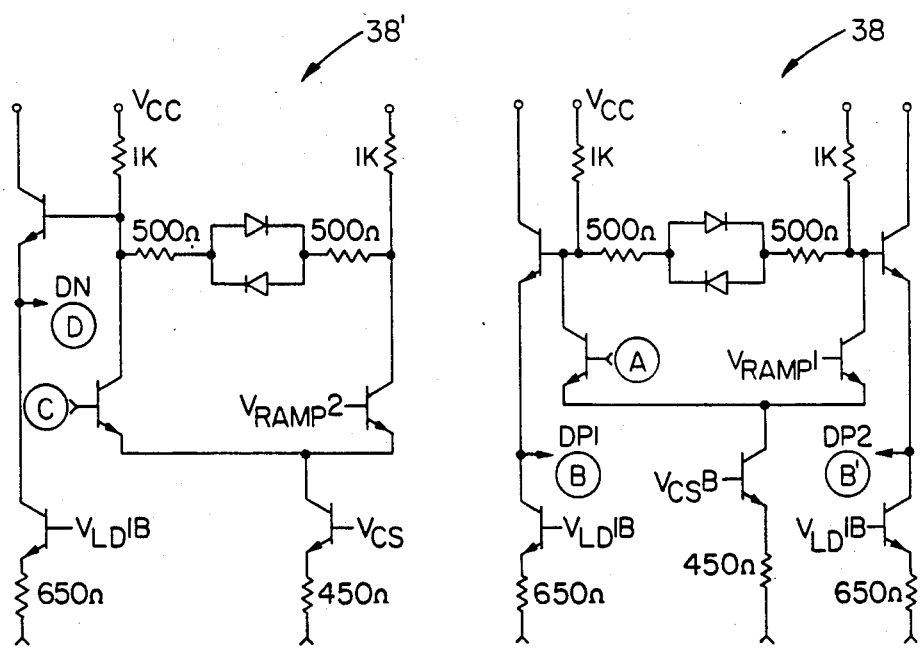
*FIG._6B.*

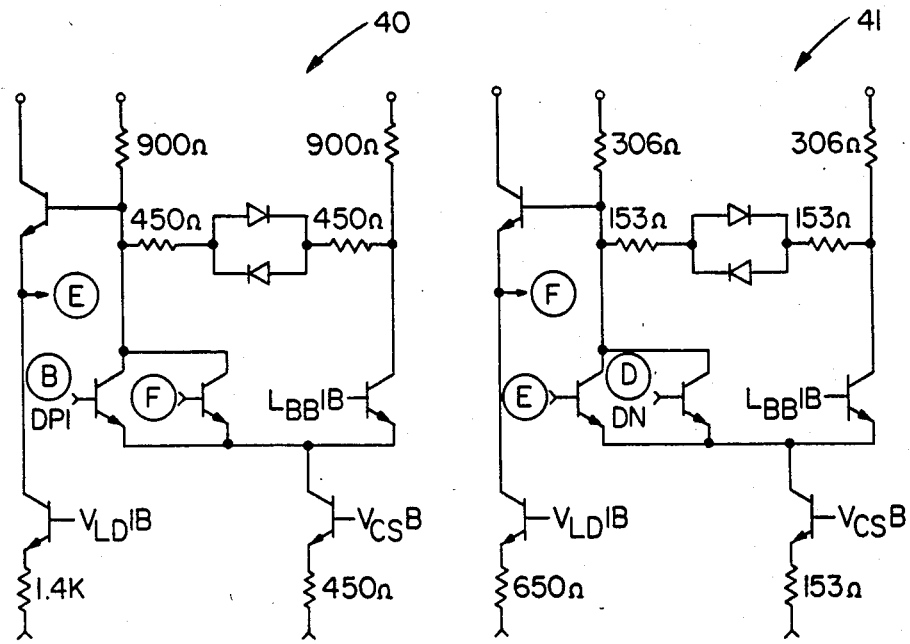
FIG._7A.    FIG._7B.
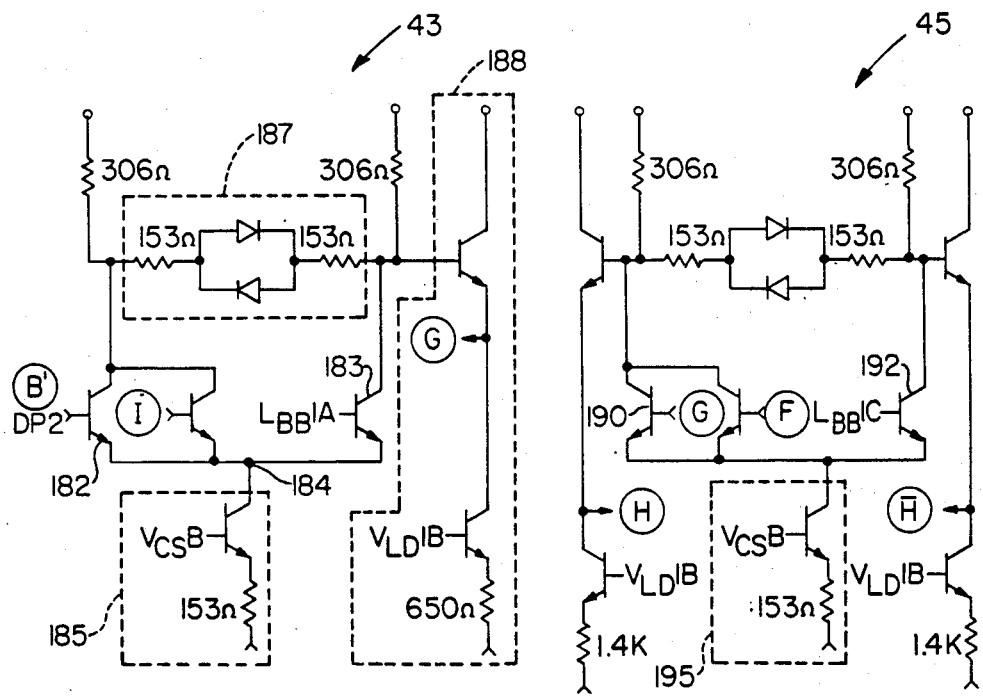
FIG._7C.    FIG._7D.

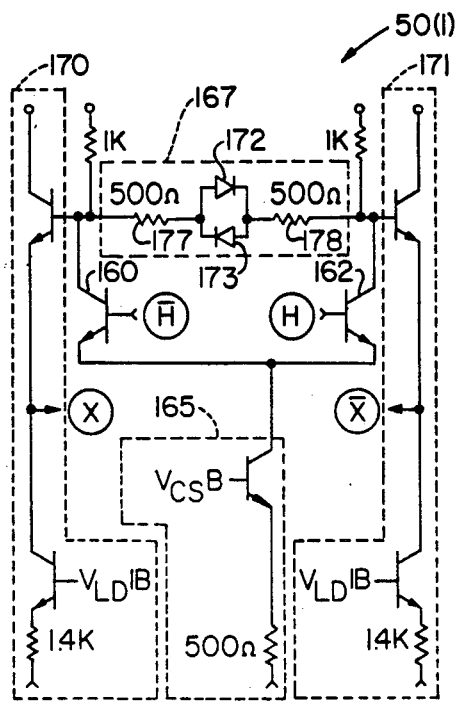
FIG._8A.
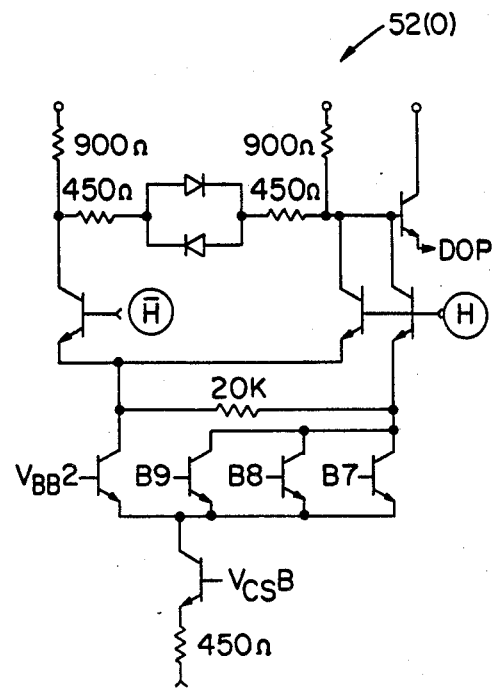
FIG._8B.
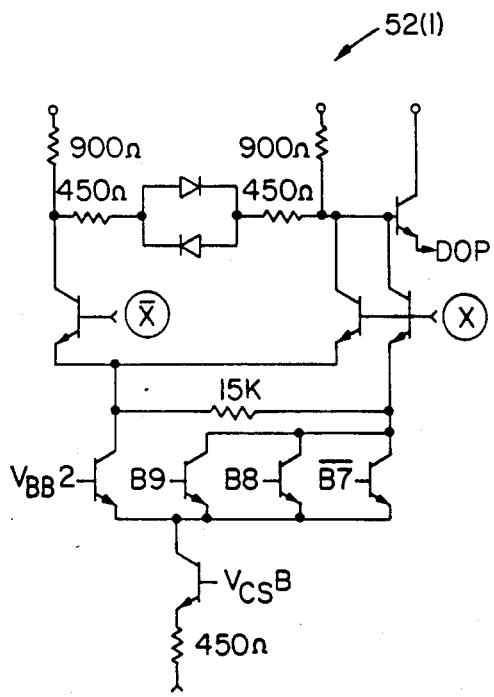
FIG._8C.
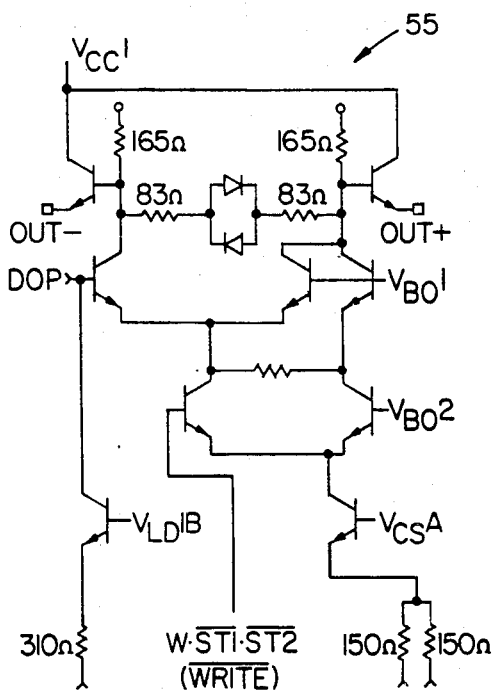
FIG._8D.

GATE HAVING TEMPERATURE-STABILIZED DELAY

This application is a continuation-in-part of U.S. Ser. No. 518,499, filed Aug. 1, 1983, now abandoned.

FIELD OF THE INVENTION

The present invention relates generally to automatic test equipment used for testing integrated circuits, and more specifically to a technique for providing precise adjustable time delays.

BACKGROUND OF THE INVENTION

In the normal course of designing integrated circuits, one solves the problem of signal propagation delay by attempting to minimize such delay. To this end, the manufacturers of integrated circuits have developed smaller, thinner, and more densely packed structures, thereby achieving speeds of operation that could scarcely have been dreamed of a decade ago. By keeping the delay through any given gate stage small enough, the overall response time of the circuit may be kept below the predetermined design level.

There are, however, certain applications where the "less-is-better" approach does not suffice. Rather, these applications require that gate delays be kept highly stable under a wide variety of conditions. An example is circuitry for deskewing electrical signals within automatic test equipment used for testing integrated circuits.

Typical automatic test equipment applies a plurality of input signals to selected pins of a device under test ("DUT") which in response produces a plurality of output signals at other selected pins. The test equipment senses the output signals and analyzes them for their compliance with quality control standards.

Under control of the test system computer and its programs, the test equipment can perform tests on a variety of integrated circuit devices. Because of the versatility of the test equipment, a particular input signal may be applied to a DUT pin over a number of different paths, and the output signals may follow a number of different paths from a DUT pin to the analysis circuitry. The resultant timing variations, commonly termed skew, must be corrected to assure the validity of the test being performed.

A typical automatic test system has in excess of 100 pins, each with associated receivers and drivers. Thus, it is required to adjustably correct hundreds of timing paths. There have been developed programmable delay lines, typically hybrid devices having a data input and a signal input and output. A binary code applied to the data input results in a corresponding propagation delay between the signal input and the signal output. Typical resolution requirements are illustrated by the Fairchild Series 20 Test System which specifies that any input timing edge can be placed anywhere from the beginning of a cycle up to 20 ns before the end of the following cycle, in increments of 156 ps.

As faster and faster test systems are designed, the resolution requirements become even more stringent. However attempts to provide programmable delay elements having a resolution at the level of 10 ps have been frustrated by apparently spurious timing fluctuations and signal distortions within the integrated circuit portion of the delay device.

SUMMARY OF THE INVENTION

The present invention provides a circuit technique for stabilizing the timing of signals at an output node of a gate, despite substantial variations in temperature.

Broadly, it has been discovered that, in a gate having a switching portion and an emitter follower, the temperature-dependence of the gate delay within the switching portion may be offset by suitable control of the temperature characteristics of the load current source supplying the emitter follower output node.

The load current source comprises a current source resistor having first and second ends, a current source transistor having its collector coupled to the output node and its emitter coupled to the first resistor end, and a reference voltage source providing a defined voltage increment between a first output terminal coupled to the base of the current source transistor and a second output terminal coupled to the second resistor end. The voltage source, rather than having a zero temperature coefficient as in known temperature-compensated configurations, is configured to have a temperature coefficient that is related to the temperature coefficients of the current source transistor's base-emitter junction and of the current source resistor so as to provide the current source with a particular temperature dependence. This particular temperature dependence is chosen to provide a temperature dependence in the delay through the emitter follower that offsets the temperature dependence of the delay through the switching portion so that the total gate delay is substantially temperature-independent.

In the preferred embodiment, the reference voltage source for the load current source is a modified band-gap regulator. The band-gap regulator comprises a regulating transistor, a current source pair of transistors Q1 and Q2, and first, second, and third resistors. The first resistor is coupled between the first output terminal and an intermediate node. The regulating transistor has its base coupled to the intermediate node and its emitter coupled to the second output terminal. Transistors Q1 and Q2 are in a current mirror configuration with the collector of transistor Q1 being coupled to the intermediate node and the base of transistor Q1 being coupled to the base and collector of transistor Q2. The emitter of transistor Q2 is coupled directly to the second output terminal while the emitter of transistor Q1 is coupled through the second resistor. The current source pair basically defines the current flowing through transistor Q1 and hence through the first and second resistors.

In the normal compensated voltage source the negative temperature coefficient of the base-emitter junction of the regulating transistor is offset by the positive temperature coefficient of the resistive voltage drop across the first resistor, to provide a temperature-stable output voltage. The present invention changes the current relationships at the intermediate node by having the third resistor coupled between the intermediate node and the second output terminal. The values of the resistors are chosen in relation to the voltage and temperature characteristics of the regulating transistor and the configuration of the current source pair to provide the desired output voltage and temperature coefficient.

BRIEF DESCRIPTION OF THE DRAWINGS

FIG. 1 is a logical schematic of a solid state deskew element utilizing the circuit technique of the present invention;

FIG. 2 is a timing diagram showing the critical timing paths within the deskew element;

FIGS. 3A-B are circuit schematics illustrating isolated threshold voltage supplies for gates in the critical timing paths;

FIG. 3C is a circuit schematic illustrating additional threshold voltage supplies;

FIG. 4A is a simplified circuit schematic illustrating a band-gap regulator for establishing a temperature-stabilized voltage;

FIG. 4B is a full circuit schematic of the band-gap regulator of FIG. 4A;

FIG. 5A is a simplified circuit schematic illustrating a modified band-gap regulator for controlling a temperature-stabilized current source;

FIGS. 5B-C are full circuit schematics of the band-gap regulator of FIG. 5A;

FIGS. 6A-B are circuit schematics illustrating the receiver and ramp generators of the fine delay circuitry;

FIGS. 7A-E are circuit schematics illustrating the pulse reconstruction gates of the fine delay circuitry; and FIGS. 8A-D are circuit schematics illustrating portions of the coarse delay circuitry.

DESCRIPTION OF THE PREFERRED EMBODIMENTS

General Circuit Operation and Structure

The present invention may best be understood by reference to its operation when incorporated into certain critical timing paths within a solid state deskew element used in automatic test equipment. FIG. 1 is a logical schematic of such a deskew element 10. In its broadest sense, the operation of the deskew element 10 is to take an incoming pulse at a differential input 12, delay it by a variable amount of time according to the digital code at a multi-bit data input 15, and present the delayed signal at a differential output 17.

The present invention relates to techniques for maintaining very precise timing. While particular timing parameters will be described, it is to be understood that the present invention is not so limited. Deskew element 10 is designed to take an incoming pulse of 5-ns width at a 20-ns repetition rate, and to provide a variable increment of delay in the range of 0-5.12 ns from nominal in steps of approximately 10 ps. To this end, the deskew element has the capability of providing an overall delay of 8.2 ns, as will now be described.

The main components of deskew element 10 are fine delay circuitry 20, coarse delay circuitry 22, latching circuitry 25, and a 7-bit digital/analog converter ("DAC") 30. Data input 15 has ten bits, seven bits of which (B0-B6) are communicated to the inputs of DAC 30; the remaining three bits (B7-B9) are communicated (as complementary pairs) to coarse delay circuitry 22. DAC 30 produces an analog voltage to 0.25-1.25 volts corresponding to the 7-bit code at its input, and a voltage derived from this is communicated to fine delay circuitry 20. This particular construction of latching circuitry 25 and DAC 30 is not directly related to the present invention, and will not be described further.

Fine delay circuitry 20 includes a differential receiver 32, first and second ramp generators 33 and 33', and a reconstruction (set/reset) latch 35. Broadly, fine delay circuitry 20 takes the differential input pulses and splits the leading and trailing edges into ramp generators 33 and 33' which compare those edges with a threshold derived from the DAC output voltage. Ramp generators 33 and 33' comprise respective capacitors 37 and 37' and respective comparators 38 and 38'. After the ramp voltages are sensed by comparators 38 and 38', the pulse is reconstructed by reconstruction latch 35.

Edge timing in fine delay circuitry 20 is approximately 800 mv/ns, whereupon the 1-volt variation in the output voltage from DAC 30 provides up to approximately 1.25 ns of controlled fine delay variation.

Latch 35 includes cross-coupled gates 40 and 41 which receive as set and reset inputs the signals from comparators 38 and 38'. The output from comparator 38 is also communicated to a first input of a gate 43. The respective outputs of gates 41 and 43 are communicated to a latch output gate 45, the differential outputs of which communicate to coarse delay circuitry 22 and also communicate via a feedback gate 47 to a second input of gate 43.

The pulse, as reconstructed at the output of gate 45, is communicated to coarse delay circuitry 22. Coarse delay circuitry 22 includes a delay line 50 comprising cascaded gate stages 50(1), 50(2), . . . and 50(7), the respective outputs of which also communicate to respective multiplexer output gates 52(1), 52(2), . . . and 52(7). (A dummy gate 50(8) ensures that the capacitance is the same at the outputs of all the gates in delay line 50.) The reconstructed pulse communicates to the input of gate 50(1), and also to a multiplexer output gate 52(0). The outputs of all output gates 52(0-7) are tied to an output buffer 55. Each gate in delay line 50 produces a 1-ns delay, for a total of up to 7 ns of coarse delay, depending on which of output gates 52(0-7) is selected by bits B7-B9 of the data inputs.

The preferred embodiment of the present invention is implemented in emitter coupled logic ("ECL"). Although the details of the circuitry will be described with reference to the circuit schematics of FIGS. 3A-8D, the basic features will be outlined at this point. In accordance with known practice, each gate stage includes a differential transistor pair having the transistors' emitters coupled to a common circuit point, and a current source coupled thereto. The transistors' collectors are resistively coupled to a supply voltage, and at least one of the transistors' collectors is coupled through an emitter follower to an output terminal. The relative current flow through the transistors (and hence the relative collector voltage) is determined by the relative voltages at the transistors' bases.

For a differential input signal, the two components are communicated to the bases; for a single-sided signal, one base receives the signal and the other base is held at a threshold voltage. The threshold voltage may be a nominally fixed reference level (as in gates 40, 41, 43, and 45) or a controlled signal reference (as in comparators 38 and 38'). The emitter follower stages through which the output signals are coupled use constant current sources for their loads.

FINE DELAY TIMING

The operation of fine delay circuitry 20 may best be understood with reference to FIG. 2 which is the timing diagram showing the signals at nodes A-H in the circuitry. The nodes are defined as follows:

A—input to comparator 38
B—output from comparator 38
C—input to comparator 38'
D—output from comparator 38'
E—output from gate 40

F—output from gate 41
G—output from gate 43
H—output from gate 45
I—output from gate 47

For purposes of illustration, the input signal may be assumed to be a 5-ns wide pulse having differential components IN+ and IN−. In the discussion that follows, it will be assumed that each gate except feedback gate 47 provides a fixed increment of delay, designated δ, which is approximately 1 ns. Feedback gate 47 is characterized by a longer gate delay, designated δ′, which is approximately 2 ns.

The positive input signal IN+ is communicated through differential input gate 32 to node A. Since the input gate has an emitter follower, the rise in IN+ causes a rapid rise at node A, one gate delay later. However, the fall in IN+ does not result in a rapid fall at node A, but rather a more gradual fall which has a slope defined by the load current and the capacitor value. Thus, the fall at node A is linear with a fall time of approximately 1.5 ns. For purposes of illustration, it will be assumed that the voltage at node A becomes equal to the DAC voltage a time interval Δ after the voltage at A begins to fall.

Consider now the signal at node B. Comparator 38 introduces one gate delay as well as inversion. When A rises, B falls one gate delay later. B rises one gate delay after A falls to a level matching the voltage of DAC 30. The trailing (rising) edge of the signal at B is one of the two edges that is ultimately reconstructed into the delayed pulse.

Similarly, the negative input signal IN− produces a signal at node C which has a leading (falling) edge having a slope defined by the constant current source and the capacitor, and a trailing (rising) edge that rises rapidly. As above, where the voltage at C reaches the DAC voltage after an interval Δ, the rising edge at node D occurs one gate delay later, and the trailing edge occurs one gate delay after C rises. The leading (rising) edge of the signal at D is the other edge that is ultimately reconstructed.

Gates 40 and 41 define a set/reset latch whose state changes each time either B or D goes high. Thus, since it is the rising edges of the signals at B and D that are to be reconstructed, the latch has the effect of reconstructing the pulse. The signals at B and D follow different paths prior to being reconstructed at H. When D rises, F falls one gate delay later, and then H falls one more gate delay later, thereby reconstructing the leading edge of D (which corresponds to the delayed leading edge of the input signal). The signal at B follows a slightly different path prior to reaching to node H. Rather than go through the latch which would add an extra delay, a look-ahead path is utilized. The signal at B is propagated through gate 43, whereupon G rises one gate delay after B rises, and H rises one more gate delay later to reconstruct the trailing edge of B (which corresponds to the delayed trailing edge of the input signal). However, the rise in H is propagated through the feedback network (characterized by the longer gate delay) to I (one of the inputs of gate 43) which causes G to fall. Thus, when B rises, G rises, but then falls a short time later because of the feedback. However, by that time, B has rise and has reset latch 35. F rises again and reinforces G so that by the time G falls, F has risen to keep H high.

In this manner, the outputs at gate 45 are delayed relative to the differential input signal by a variable amount Δ (in addition to four fixed gate delays).

It will be appreciated that the paths through fine delay circuitry 20 and coarse delay circuitry 22 represent critical timing paths where the stability of delays must be maintained. Moreover, the pulse width must not be distorted on passage of the pulse through the circuitry. The techniques for maintaining stable timing may be understood by referring to the circuit schematics of FIGS. 3A-8D.

Generation of Fixed Voltages

In order that the understanding of the schematics be facilitated, and further in view of the fact that certain aspects of the present invention relate to the nominally fixed voltages and their characteristics, these voltages will be discussed first.

The highest voltage in the circuit, designated $V_{CC}$, is at ground. The lowest voltage in the circuit, designated $V_{EE}$, is nominally 4.5 volts below $V_{CC}$, although this can vary by as much as ±10%.

A first set of voltages is referenced to $V_{CC}$. These include $V_{BB}1$ and $L_{BB}1$ which are 1.3 volts below $V_{CC}$ (that is, −1.3 volts), and $V_{BB}2$ and $L_{BB}2$ which are one diode drop lower than $V_{BB}1$ and $L_{BB}1$ (that is, −2.1 volts). Signal swings relative to these voltages are 0.4 volts above for a high and 0.4 volts below for a low.

A second set of voltages in the circuit are referenced relative to $V_{EE}$. These include $V_{CS}A$ and $V_{CS}B$ which are 1.3 volts above $V_{EE}$ (nominally −3.2 volts), and $V_{LD}1$ and $V_{LD}2$ which are 1.5 volts above $V_{EE}$.

FIG. 3A is a circuit schematic illustrating the generation of the $L_{BB}1$ voltage. For reasons to be discussed below, three separate isolated threshold voltage sources 80a, 80b, and 80c are used to provide corresponding (and nominally equal) voltages $L_{BB}1A$, $L_{BB}1B$, and $L_{BB}1C$. Referring, for example, to voltage source 80a, the level $L_{BB}1$ relative to $V_{CC}$ is determined by a dropping resistor 81 and a current source 82 controlled by the voltage $V_{CS}$ relative to $V_{EE}$. The $L_{BB}1$ voltage is provided at an emitter follower 83 having a load current source 84 (also controlled by $V_{CS}$).

FIG. 3B is a circuit schematic illustrating the generation of the threshold voltage from DAC 30 as provided to comparators 38 and 38′. For reasons to be discussed below, separate isolated threshold voltage sources 87a and 87b are used to provide corresponding (and nominally equal) voltages $V_{RAMP}1$ and $V_{RAMP}2$. The voltage DACOUT drives separate emitter followers 88a and 88b whose loads are respective current sources 90a and 90b controlled by the voltage $V_{LD}2$.

FIG. 3C is a circuit schematic illustrating the generation of the voltages $V_{BB}1$ and $V_{BB}2$ by a voltage source 95 and the voltages $V_{BO}1$ and $V_{BO}2$ by a voltage source 97. These four voltages, like $V_{BB}1$ and $L_{BB}1$, are controlled by $V_{CS}$.

FIG. 4A is a simplified circuit schematic of a band-gap regulator 100 used to generate the $V_{CS}$ voltage which, as discussed above, provides a 1.3-volt interval where $V_{EE}$. The basic operation of band-gap regulator 100 is to provide an output voltage $V_0$ having a substantially zero temperature coefficient, which is achieved by balancing the negative temperature coefficient of a base-emitter junction with the positive temperature coefficient of a resistive voltage drop. $V_0$ is provided at a node 102 which is coupled to the emitter of a transistor 103. Band-gap regulator further includes a regulating transistor 105, a current source pair of transistors 107 (Q1) and 110 (Q2), and resistors 112 and 113 having respective values $R_1$ and $R_2$. Transistors 107 and 110 are in a "current mirror" configuration, but carry different currents due to the fact that the emitter of transistor 110 is coupled directly to $V_{EE}$ while the emitter of transistor 107 is coupled to $V_{EE}$ through a resistor 113. A node 120, which is the commonly coupled collector of transistor 107 and base of transistor 105 is coupled to node 102 through resistor 112. Node 102 (first output terminal) is at a voltage $V_0$, node 120 at a voltage $V_1$, and the emitter of transistor 107 at a voltage $V_2$, all voltages being defined relative to $V_{EE}$ (second output terminal). A resistor 122, coupled between node 102 and the commonly coupled base and collector of transistor 110, provides a current path to the base of transistor 107 and the base and collector of transistor 110.

The voltage $V_0$ is the sum of the voltage drop across resistor 112 and the voltage $V_1$ across the base-emitter junction of transistor 105. Also, assuming a negligible amount of base current into transistor 105, the voltage drop across resistor 112 is related to the voltage drop across resistor 113 by the ratio of the resistor values. This may be expressed mathematically as follows:

$$V_0 = V_1 + (R_1/R_2)V_2 \qquad \text{(Eq. 1)}$$

The voltage $V_2$ may be determined from the diode equation and is given in terms of the ratio of the currents through transistors 107 and 110 as follows:

$$V_2 = (kT/q) \ln (J_2/J_1) \qquad \text{(Eq. 2)}$$

where
KT/q is the thermal voltage 26 mv for 300° K., and
$J_1$ and $J_2$ are the current densities through transistors 107 and 110.

For $V_1 = 0.7$ volts, it is found that $(dV_1/dT) = -2.0$ mv/°C. Also, for $(J_2/J_1) = 10$, it is found that $V_2 = 60$ mv at 300° C. and $(dV_2/dT) = +0.2$ mv/°C.

Differentiating Equation 1 with respect to T and setting $(dV_0/dT) = 0$ leads to the requirement that $(R_1/R_2) = 10$. Substituting into Equation 1 gives $V_0 = 0.7 + (10)(0.060)$ volts = 1.3 volts, the "band-gap" voltage with the desired zero temperature coefficient.

While the above represents a simplified explanation, it is nevertheless substantially correct. FIG. 4B shows the preferred implementation of band-gap regulator 100 with reference numerals corresponding to those in FIG. 4A being used where appropriate. The voltage at the base of transistor 103 is communicated to output cells 130a and 130b, more specifically to the respective bases of transistors 132a and 132b therein. The emitters of transistors 132a and 132b provide the desired output voltages $V_{CS}A$ and $V_{CS}B$. So long as transistors 132a and 132b and transistor 103 have the same temperature characteristics for their base-emitter junctions, the voltages $V_{CS}A$ and $V_{CS}B$ will have the same zero temperature coefficient as the voltage $V_0$ at node 102. Output cells 130a and 130b also contain compensating networks to provide second-order correction.

FIG. 5A is a simplified circuit schematic of a band-gap regulator 150 used to generate the voltages $V_{LD}1A$, $V_{LD}1B$, and $V_{LD}2$, designated generically as $V_{LD}$. As will be described below, the $V_{LD}$ voltages are required to have a non-zero, but well defined, temperature coefficient in order to provide load current sources having particular temperature dependence. Primed reference numerals will be used for circuit components corresponding to those in FIG. 4A.

Band-gap regulator 150 differs from band-gap regulator 100 in FIG. 4A by the provision of a resistor 155 having a value $R_3$ between node 120' and $V_{EE}$. The dominant temperature characteristic of the circuit is provided by resistor 155. The above analysis follows through which certain modifications. More particularly, the voltage drop across resistor 112' is no longer related to the voltage drop across resistor 113' by the simple ratio of the resistor values, since resistor 155 provides an additional current path. Rather, Equation 1 is modified to account for this as follows:

$$V_0 = \left(1 + \frac{R_1}{R_3}\right) V_1 + \frac{R_1}{R_2} V_2 \qquad \text{(Eq. 3)}$$

This equation may be differentiated with respect to temperature, and the temperature coefficient of $V_0$ is given as follows:

$$\frac{dV_0}{dT} = \left(1 + \frac{R_1}{R_3}\right) \frac{dV_1}{dT} + \frac{R_1}{R_2} \frac{dV_2}{dT} \qquad \text{(Eq. 4)}$$

If the desired $V_0$ and $dV_0/dT$ are known, Equations 3 and 4 can be solved for the required resistor ratios. For example, for $V_1 = 0.8$ volts, $V_2 = 0.06$ volts, $dV_1/dT = -2$ mv/°C. and $dV_2/dT = +0.2$ mv/°C., and further assuming a desired value of $V_0 = 1.5$ volts and a desired temperature coefficient of $-0.6$ mv/°C., the equations to be solved may be written as follows:

$$(0.8)\left(1 + \frac{R_1}{R_3}\right) + (0.06)\frac{R_1}{R_2} = 1.5 \qquad \text{(Eq. 5)}$$

$$(-2)\left(1 + \frac{R_1}{R_3}\right) + (0.2)\frac{R_1}{R_2} = -0.6$$

Solving these equations yields the resistor ratios $(R_1/R_3) = 0.2$ and $(R_1/R_2) = 9$.

This discussion is somewhat idealized in that the temperature coefficient of $V_2$ does not remain precisely constant at 0.2 mv/°C. when $V_0$ is no longer temperature independent. Accordingly, rather than the simple set of linear equations, transcendental equations would have to be solved, as for example by means of a circuit simulation computer program. However, the basic discussion above adequately illustrates the behavior and general considerations involved in designing the circuit. FIGS. 5B and 5C are circuit schematics of band-gap regulator circuits 157 and 158 for generating the $V_{LD}$ voltages.

General Gate Structure

FIGS. 6A-B are circuit schematics illustrating input receiver 32, capacitors 37 and 37', and comparators 38 and 38' in fine delay circuitry 20. FIGS. 7A-E are circuit schematics illustrating gates 40, 41, 43, 45, and 47 in fine delay circuitry 20. FIGS. 8A-D are circuit schematics illustrating gate stage 50(1), multiplexer output gates 52(0-1), and output buffer 55 in coarse delay circuitry 22.

The structure of the gates may be understood with initial reference to gate 50(1) shown in FIG. 8A. Gate 50(1) comprises a differential pair having emitter-coupled transistors 160 and 162, a current source 165, a collector network 167, and emitter followers 170 and 171. Collector network 167 includes the series combination of a pair of cross-coupled diodes 172 and 173 and a pair of resistors 177 and 178.

In accordance with prior known practice, gate 50(1) (as well as the other gates in the deskew element) is temperature-compensated to provide signal levels that do not vary with temperature. To this end, current source 165 is controlled by a voltage ($V_{CS}$) that is stable with respect to temperature, and the diode pair is included so that its temperature characteristics compensate for the temperature dependence of the base-emitter junction voltage of the transistors in emitter followers 170 and 171.

The remaining discussion deals with specific circuit techniques for stabilizing the timing of signals in critical timing paths. These will be described in connection with various gates shown in the circuit schematics of FIGS. 6A–8D.

Isolated Voltage References

As discussed above in connection with the timing diagram of FIG. 2, the critical timing paths are A-B-G-H and C-D-F-H. Thus, the trailing edge of IN+ has to propagate through cascaded stages 38, 43, and 45 while the leading edge of IN− has to propagate through cascaded stages 38, 41, and 50(0).

It has been discovered that spurious timing effects can arise from signal coupling between stages, and more particularly from coupling via the voltage supply that defines the threshold levels for such stages. Such coupling has been found to occur between cascaded gate stages, and also between parallel stages which are expected to undergo signal transitions within the same narrow time interval.

With reference to FIGS. 7C–D, consider cascaded gate stages 43 and 45 through which the signal DP2 (from comparator 38) must propagate. Gate 43 includes a differential pair having first and second transistors 182 and 183, the emitters of which are coupled to a common circuit point 184, and a current source 185 coupled to circuit point 184. The collectors of transistors 182 and 183 are coupled via a collector network 187. The collector of transistor 183 is communicated to an emitter follower 188, the output of which is communicated to the input of gate 45. In a similar fashion, gate 45 includes a differential pair having first and second transistors 190 and 192 and a current source 195. The input signal DP2 is communicated to the base of transistor 182; the output from gate 43 is communicated to the base of transistor 190.

The bases of respective second transistors 183 and 192 are held at voltage $L_{BB}1$ (nominally −1.3 volts). However, in accordance with the desire to eliminate signal coupling, the threshold reference voltages supplied to the bases of transistors 183 and 192 are provided by separate isolated voltage sources 80a and 80c (FIG. 3A) for $V_{BB}1A$ and $V_{BB}1C$. Similarly, with reference to FIGS. 7B and 7D, since gates 41 and 45 are cascaded, gate 41 is thresholded with $V_{BB}1B$ as provided by voltage source 80b (FIG. 3A).

The use of isolated threshold voltage supplies has the effect of eliminating spurious coupling between stages. The significance of this is best understood by considering the hypothetical operation of a circuit having cascaded gate stages that are thresholded by the same supply. Basically, when the input signal to the first transistor goes low, the second transistor in the pair is turned on, and an extra increment of charge ($q_F$) is drawn from the threshold voltage supply in order to charge up the active region in the base of the transistor. The extra current draw causes a small dip in the threshold voltage that is sensed in the second gate stage. This dip persists beyond the propagation delay time, so that the output signal from the first stage is sensed at the second gate against a different threshold. Thus, for example, if the voltage dips from −1.3 volts to −1.4 volts, the timing would be disturbed by an increment that corresponds to the time difference between the output signal passing through −1.3 volts and −1.4 volts. Similarly, when the input signal to the first transistor goes high, the second transistor in the pair is turned off, and current flows into the threshold voltage supply. This causes an increase in the threshold voltage, with a corresponding increment in the timing. Depending on the relative sense of the output from the first gate stage (inverting or non-inverting), both edges will be subjected to delay or advancement. This delay or advancement is cumulative as the signal passes through several cascaded stages.

However, the problem of signal coupling is not merely one of absolute delays, since other signals in the system can cause only one edge of the signal to be affected. Moreover, a system without isolated threshold supplies can suffer from problems where the trailing edge of the signal in the first stage has its timing disturbed by the switching caused by the leading edge of the same signal in the second (or later) stage.

As alluded to above, an analogous problem is present in parallel stages such as comparators 38 and 38′. In this case, both comparators are conditioned, in effect, by the same analog voltage from DAC 30. Were a single voltage derived from the DAC output (designated DACOUT) used, the initial rapid switching at node A would cause a change in the voltage due to the extra increment of current, and this would upset the timing at which the comparison of the sloping edge at node C occurred. Similarly, when the voltage at node C rose rapidly at the trailing edge of the pulse, the threshold voltage would change, and adversely affect the critical timing on the sloping edge of the pulse at node A. This is not a problem of cascaded stages, but rather is a problem of parallel stages where cross-coupling occurs through the common threshold voltage. As can be seen in FIG. 6B, the present invention overcomes this problem by providing comparators 38 and 38′ with separate commonly derived voltages $V_{RAMP}1$ and $V_{RAMP}2$ generated by isolated supplies 87a and 87b (FIG. 3B).

Thus, by using isolated threshold voltage sources, unpredictability and signal dependence are eliminated so that signals may propagate through cascaded or parallel gate stages without signal history dependent skew and distortion.

Balanced Collector Network

As can be seen in FIGS. 6A–8D, the temperature compensating networks are of a special symmetric configuration. For example, in gate 50(1) in FIG. 8A, the series resistance with the diode pair (172 and 173) is split between two resistors (177 and 178).

It has been discovered that significant signal distortion and skew can be attributed to unbalanced capacitance at the collector nodes. This distortion and skew may be avoided by the present configuration which provides a symmetric collector network so that the capacitance is balanced at both collector nodes.

The significance of this is best understood by considering a hypothetical structure in which the load was not so balanced. In such a case, the signal on one collector would encounter a different capacitance than that on the other, which would mean that the absolute delay would be different for the inverting and non-inverting outputs. In a differential gate this would cause some uncertainty in the transitions on succeeding gate stages. This would present a stability problem, and also a pulse integrity problem, since each gate stage could have the effect of shortening or lengthening the pulse passing through it.

While this balanced load configuration is used in almost all the other differential pair gates in the circuitry, the benefits are most critical in delay gates 50(1-7). This is because each stage must be non-inverting so that the output signal may be taken off any stage, as selected by the three high order data bits (B7-B9). It is therefore impossible to cancel out effects of the imbalance by switching from positive to negative between stages. Even a relatively small disparity, as for example 0.05 ns, could result in a cumulative distortion of 0.4 ns arising solely out of the passage through gates 50(1-7).

An additional problem with the hypothetical unbalanced node structure relates to the temperature deendence of the delays. As will be described in more detail below, it has been discovered that the increase in gate delay as a function of temperature can be offset by providing a current source in the emitter follower having particular temperature characteristics. In the event that the rise and fall characteristics were different for the two collector nodes, the two emitter followers would have to be configured differently, which would add an undesirable degree of complication to the circuit.

Temperature-Compensating Load Current

As can be seen in FIGS. 6A-8D, the output of each gate stage includes an emitter follower which comprises a transistor and a current source (controlled by one of the $V_{LD}$ voltages) as the emitter load. It has been discovered that it is possible to maintain timing that is stable with respect to temperature variations by suitable configuration of load current source temperature coefficient. This is to be contrasted to the standard compensated current sources within the gates which have a controlling voltage ($V_{CS}$) which is characterized by a zero temperature coefficient.

Referring to FIG. 6A for a specific example, node A at the output of differential receiver 32 is perhaps the most sensitive node in the whole system. Node A is driven by an emitter follower comprising a transistor 220 and a current source 222. Current source 222 includes a transistor 225 and a resistor 227 in a standard current source configuration. The base of transistor 225 is controlled by one of the $V_{LD}$ voltages, namely $V_{LD}2$.

The delay through a gate stage will normally increase with respect to temperature due to a decrease in the transistors' transconductance. It has been discovered that this increase can be offset by providing a load current having a particular temperature dependence. Increasing the load current has the effect of slowing down the rise time (increased load) and speeding up the fall time (faster pull down). While these effects offset one another, the speeding of the fall is found to predominate, so that the delay actually decreases with increading load (at least when the load current is considerably less than the gate current). Thus, the temperature-dependence of the delay may be offset by providing suitably tailored load current source. The standard compensated current sources (controlled by $V_{CS}$) within the gates are not suitable, since they over-correct. A source having a reduced temperature coefficient is needed.

Consider a specific case where analysis (as for example a computer simulation) shows that the temperature dependence required to stabilize delay is $(1/I)(-dI/dT) = +0.06\%/°C$. The required temperature dependence of the control voltage may be found as follows.

The voltage $V_{LD}$ is the sum of the voltage $V_{BE}$ across the base-emitter junction of transistor 225 and the voltage drop IR across resistor 227.

$$V_{LD} = V_{BE} + IR \qquad \text{(Eq. 6)}$$

Differentiating Equation 6 with respect to temperature gives:

$$\frac{dV_{LD}}{dT} = \frac{dV_{BE}}{dT} + IR\left(\frac{1}{I}\frac{dI}{dT} + \frac{1}{R}\frac{dR}{dT}\right) \qquad \text{(Eq. 7)}$$

The base-emitter voltage of transistor 225 has a negative temperature coefficient while resistor 227 has a positive temperature coefficient. For $IR = 0.7$ volts, $(dV_{BE}/dT) = -1.4$ mv/°C., $(1/I)(-dI/dT) = +0.06\%/°C$., and $(1/R)(dR/dT) = +0.061\%/°C$. Equation 6 leads to a value $$dV_{LD}/dT = (-1.4 \text{ mv/°C.}) + (700 \text{ mv})(0.0006/°C. + 0.0006/°C.)$$

$$= -0.6 \text{ mv/°C.}$$

A voltage source suitable for providing such a temperature coefficient was discussed above in connection with the description of band-gap regulators 157 and 158 for generating the $V_{LD}$ voltages (FIGS. 5A-C).

The constant current loads are also important in the coarse delay stages since the capacitance at the output is high. Referring to FIG. 8A, the load currents powering the outputs of gates 50(1-7) and the common output of gates 52(0-7) are controlled by $V_{LD}1B$. To give an indication of the significance of choosing the current source temperature coefficient properly, if the standard compensated current source (controlled by $V_{CS}$) were used, the resulting increase in current with temperature would result in approximately a 30 ps/°C. increase in speed at the multiplexer output. Such a characteristic is clearly intolerable in a circuit where timing delays are maintained stable with respect to other parameters at the picosecond level.

In summary it can be seen that the present invention provides a circuit technique for establishing and maintaining extremely precise and reproducible delay increments. While the above description and illustrations provide a full and complete disclosure of the preferred embodiment of the invention, alternate constructions, modifications, and equivalents may be employed without departing from the true spirit and scope of the present invention. Accordingly, the scope of the present invention is to be determined by the appended claims.

We claim:

1. In a gate including a switching portion and an emitter follower, wherein the switching portion defines a collector mode, the voltage at which is representative of an input signal and is characterized by a delay time relative to the input signal having a particular temperature dependence, and wherein the emitter follower includes a load current source and an emitter follower transistor having its base coupled to the collector node and its emitter coupled to the load current source to define an output node, the improvement wherein the load current source comprises:

a current source resistor having first and second ends, said resistor having a temperature-dependent behavior characterized by a first temperature coefficient;

a current source transistor having its collector coupled to the output node and its emitter coupled to said first resistor end, the voltage drop across the junction defined by the base and emitter of said current source transistor having a temperature-dependent behavior characterized by a second temperature coefficient; and a reference voltage source having a first voltage output terminal coupled to the base of said current source transistor and a second voltage output terminal coupled to said second resistor end for providing a defined voltage increment therebetween, said voltage increment having a temperature-dependent behavior characterized by a third temperature coefficient;

wherein said first, second, and third temperature coefficients define a fourth temperature coefficient that characterizes the temperature-dependence of the load current source, which fourth temperature coefficient imparts a temperature dependence to the delay time in the emitter follower that is related to the particular temperature dependence of the delay time in the switching portion so as to compensate therefor and provides a total delay in the gate that is substantially temperature-independent.

2. The invention of claim 1 wherein the particular temperature dependence of the delay time in the switching portion is characterized by a positive temperature coefficient, and wherein the current supplied by the load current source is characterized by a positive temperature coefficient.

3. The invention of claim 1 wherein the switching portion comprises a differential transistor pair having emitter-coupled first and second transistors and a collector network having a cross-coupled diode pair in series with at least one resistor to provide voltage swings at the output node having levels that exhibit substantial temperature independence.

4. A temperature-compensated gate structure comprising:

a differential pair including first and second gate transistors having their respective emitters coupled to a common circuit point;

a gate current source coupled to said common circuit point to provide current flow through said gate transistors, the relative flow through said gate transistors being determined by the relative voltage levels at the respective bases of said gate transistors;

wherein an output signal representative of an input signal at the base of at least one of said gate transistors appears at the collector of said first gate transistor, and bears a temperature-dependent time relationship to the input signal, thus defining a partial gate delay and a temperature coefficient thereof;

an emitter follower transistor having its base connected to the collector of said first gate transistor, and having its emitter coupled to an output node; and a load current source including
      a resistor having first and second ends, said resistor being characterized by a first temperature coefficient,
      a current source transistor having its collector coupled to said output node and its emitter coupled to said first resistor end, the voltage drop across the base-emitter junction of said current source transistor being characterized by a second temperature coefficient, and
      a reference voltage source having a first voltage output terminal coupled to the base of said current source transistor and a second voltage output terminal coupled to said second resistor end for providing a defined voltage increment therebetween, said voltage increment being characterized by a third temperature coefficient,
      wherein said first, second, and third temperature coefficients define a fourth temperature coefficient that characterizes said load current source;
      wherein said fourth temperature coefficient is of the same sign as the temperature coefficient of said partial gate delay so that a change in temperature that increases the partial gate delay through said differential pair also increases the load current to decrease the delay through said emitter follower, in a manner that provides a total delay in the gate that is substantially temperature-independent.

5. The invention of claim 4 wherein said reference voltage source is a band-gap regulator operable to supply a voltage $V_0$ characterized by a temperature coefficient $dV_0/dT$, comprising:

a regulating transistor having its base connected to an intermediate node and its emitter connected to said second voltage output terminal, the voltage across the base-emitter junction of said regulating transistor being denoted $V_1$ and being characterized by a temperature coefficient $dV_1/dT$;

a current source pair of transistors Q1 and Q2 in a current mirror configuration, transistor Q1 having its collector coupled to said intermediate node, transistor Q2 having its base and collector coupled to the base of transistor Q1 and its emitter coupled to said second voltage output terminal;

means defining current paths to the base of transistor Q1, to the base and collector of transistor Q2, and to said first voltage output terminal;

a first resistor having value $R_1$ coupled between said first voltage output terminal and said intermediate node;

a second resistor having value $R_2$ coupled between the emitter of transistor Q1 and said second voltage output terminal, the voltage across said second resistor being denoted $V_2$ and being characterized by a temperature coefficient $dV_2/dT$; and a third resistor having value $R_3$ coupled between said intermediate node and said second voltage output terminal;

wherein the relative values of $R_1$, $R_2$, and $R_3$ are chosen in relation to the values $V_1$, $V_2$, $dV_1/dT$, and $dV_2/dT$ so as to provide the desired values of $V_0$ and $dV_0/dT$ that provide said current source with the desired temperature coefficient.

6. In a band-gap regulator for providing an output voltage $V_0$ between first and second output terminals, voltage $V_0$ being characterized by a desired temperature coefficient $dV_0/dT$, the band-gap regulator including a regulating transistor having a its base connected to an intermediate node and its emitter connected to the second output terminal, the voltage across the base-emitter junction of the regulating transistor being denoted $V_1$ and being characterized by a temperature coefficient $dV_1/dT$, a current source pair of transistors Q1 and Q2 in a current mirror configuration, transistor Q1 having its collector coupled to the intermediate node, transistor Q2 having its base and collector coupled to the base of transistor Q1 and its emitter coupled to said second output terminal, means defining current paths to the base of transistor Q1, to the base and collector of transistor Q2, and to the first voltage output terminal, a first resistor having value $R_1$ coupled between the first output terminal and the intermediate node, whereupon the voltage between said first and second output terminals is equal to the sum of the voltage drop across the first resistor and the voltage $V_1$ across the base-emitter junction of the regulating transistor, and a second resistor having value $R_2$ coupled between the emitter of transistor Q1 and the second output terminal, the voltage across the second resistor being denoted $V_2$ and being characterized by a temperature coefficient $dV_2/dT$, the improvement comprising:

a third resistor having value $R_3$ coupled between the intermediate node and the second output terminal, the relative values of $R_1$, $R_2$, and $R_3$ being chosen in relation to the values of $V_1$, $V_2$, $dV_1/dT$, and $dV_2/dT$, to provide the desired values of $V_0$ and $dV_0/dT$.

* * * * *